United States Patent [19]
Nakanishi et al.

[11] Patent Number: 5,478,438
[45] Date of Patent: Dec. 26, 1995

[54] METHOD OF ETCHING SEMICONDUCTOR SUBSTRATE

[75] Inventors: Hideyuki Nakanishi, Kyoto; Akira Ueno, Osaka; Hideo Nagai, Osaka; Akio Yoshikawa, Osaka, all of Japan

[73] Assignee: Matsushita Electronics Corporation, Takatsuki, Japan

[21] Appl. No.: 175,629

[22] Filed: Dec. 30, 1993

[30] Foreign Application Priority Data

Jan. 7, 1993 [JP] Japan ................................ 5-001161

[51] Int. Cl.⁶ .................................................. H01L 21/00
[52] U.S. Cl. ................................ 156/647.1; 156/651.1; 156/661.11; 156/662.1
[58] Field of Search ........................ 156/647, 651, 156/654, 657, 659.1, 661.1, 662, 904; 252/79.5

[56] References Cited

U.S. PATENT DOCUMENTS 5,277,755  1/1994  O'Neill ........................ 156/647
5,316,618  5/1994  Van Lintel ..................... 156/647 X

*Primary Examiner*—William Powel
*Attorney, Agent, or Firm*—Willian Brinks Hofer Gilson & Lione

[57] ABSTRACT

A method of performing anisotropic etching more than once with respect to a semiconductor substrate (1) is provided with the steps of performing first-time anisotropic etching by using a first etching mask (2) so as to form a first anisotropically etched region (4) which is hollow, forming a second etching mask (7) over the first etching mask (2), performing second-time anisotropic etching by using the second etching mask (7), and previously forming the first etching mask (2) from a material which is resistant to an etchant used for patterning the second etching mask (7) before the first-time anisotropic etching is performed. Thus, the edge portion (6) of the first etched region (4) is protected so that its configuration is excellently maintained. By way of example, either of the etching masks is composed of a dielectric material such as a silicon dioxide film, while the other etching mask is composed of a metallic material such as Au and Ti, and the second-time anisotropic etching is performed by using diluted potassium hydroxide.

11 Claims, 7 Drawing Sheets

Fig.1(a) Bare Silicon Substrate 

Fig.1(b) Thermal Oxidation 

Fig.1(c) Application of Photoresist 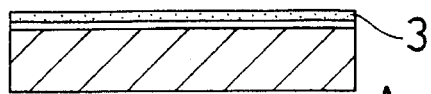

Fig.1(d) Patterning of Photoresist 

Fig.1(e) Etching for Patterning SiO₂ Film 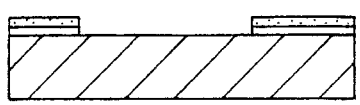

Fig.1(f) Removal of Photoresist 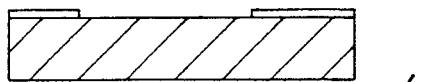

Fig.1(g) 1st-Time Anisotropic Etching of Silicon 

Fig.1(h) Vapor Deposition of Au 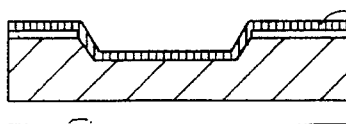

Fig.1(i) Application of Photoresist 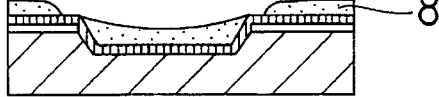

Fig.1(j) Patterning of Photoresist 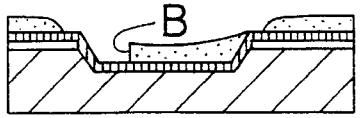

Fig.1(k) Patterning of Au Film 

Fig.1(l) Removal of Photoresist 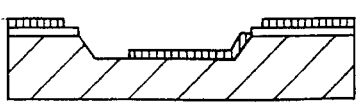

Fig.1(m) 2nd-Time Anisotropic Etching of Silicon 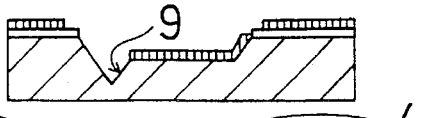

Fig.1(n) Removal of Au and SiO₂ Films 

Prior Art
Fig.4(a) Bare Silicon Substrate 
Fig.4(b) Formation of Thermal Oxidation Film 
Fig.4(c) Application of Photoresist 
Fig.4(d) Patterning of Photoresist 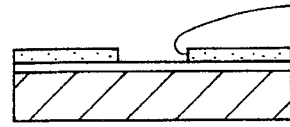
Fig.4(e) Etching for Patterning Thermal Oxidation Film 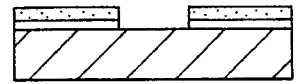
Fig.4(f) Removal of Photoresist 
Fig.4(g) Anisotropic Etching of Silicon 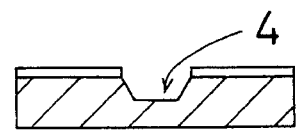

Fig.6(a) Wafer after 1st-Time Anisotropic Etching 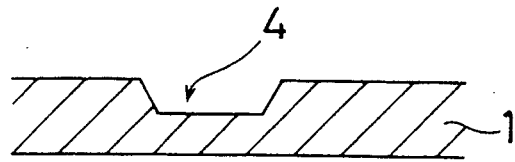
Fig.6(b) Formation of Thermal Oxidation Film 
Fig.6(c) Application and Patterning of Photoresist 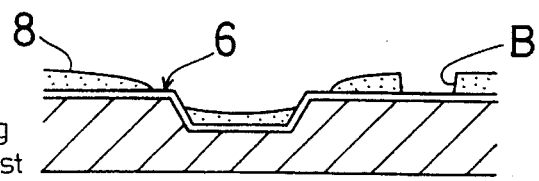
Prior Art
Fig.6(d) Etching for Patterning Thermal Oxidation Film 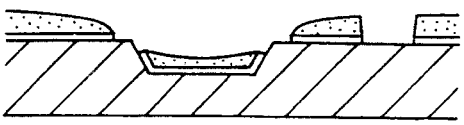
Fig.6(e) Removal of Resist 
Fig.6(f) 2nd-Time Anisotropic Etching 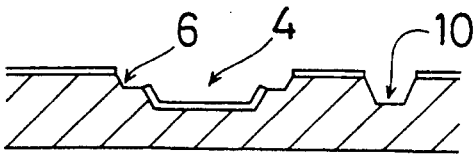

METHOD OF ETCHING SEMICONDUCTOR SUBSTRATE

BACKGROUND OF THE INVENTION

The present invention relates to a method of etching a semiconductor substrate and, more particularly, it relates to a process of anisotropic etching.

In a conventional process for fabricating a single-crystal semiconductor substrate, there has widely been used a so-called anisotropic etching technique. To etch the single-crystal substrate non-isotropically, this technique uses a solution with which individual surface regions of the single-crystal substrate are etched at different rates depending on their respective directions, based on the fact that each surface plane has different activation energy in accordance with its crystallographic direction.

FIGS. 4(a) to 4(g) illustrate an example of the conventional process for anisotropically etching the semiconductor substrate.

As shown in FIG. 4(a), a bare silicon substrate 1 having surface plane (100) is prepared. First, the surface of the silicon substrate 1 composed of bare silicon is thermally oxidized so as to form a $SiO_2$ film 2 (see FIG. 4(b)). Next, a first photoresist 3 is applied onto the $SiO_2$ film 2 (see FIG. 4(c)). The resulting first photoresist 3 is then patterned so that a specified opening A is formed in a part of the photoresist 3 (see FIG. 4(d)). After etching away the pare of the $SiO_2$ film 2 which underlies the opening A (FIG. 4(e)), the first photoresist 3 is removed (FIG. 4(f)).

Subsequently, the entire substrate is subjected to first-time anisotropic etching so that the silicon substrate 1 underlying the opening A of the $SiO_2$ film 2 is grooved, thereby forming a first etched region 4 which is hollow with a specified difference in level (see FIG. 4(g)).

As the solution for anisotropically etching the silicon substrate 1, ethylene diamine, potassium hydroxide, pyrocatechol, and the like are known. An etching mask which is not dissolved in these solutions is usually composed of a $SiO_2$ film.

Thus, the conventional process comprises the steps of thermally oxidizing the silicon substrate 1 so as to form the $SiO_2$ film 2 composed of a thermal oxidation film, patterning the resulting $SiO_2$ film 2 by using a normal photolithographic technique, and finally etching the substrate with the patterned $SiO_2$ film serving as an etching mask by immersing it in the anisotropic etchant solution. If the patterned $SiO_2$ film serving as an etching mask is formed with a window region having as its side the (110) direction of the silicon substrate, the resulting etched region 4 is in the form of a truncated pyramid or a pyramid having the (111) plane (forming a 54° angle with respect to the main face of the substrate) as its slant faces, for the (100)-Si substrate is used.

A first problem of the prior art mentioned above arises when the anisotropic etching step is repeated more than once.

That is, after performing the first anisotropic etching, the surface of the silicon substrate 1 becomes rugged as shown in FIG. 5, so that, if a second photoresist 8 is to be applied by spin coating, a discontinuity is easily generated in the photoresist 8 at the edge portion 6 of the first etched region 4. The discontinuity results from the increasing thinning of the photoresist at the edge portion 6, which is caused while the second photoresist 8 is applied by spin coating, for the second photoresist 8 is spread by utilizing a centrifugal force.

The generation of the discontinuity can be prevented to some extent by adjusting the rotational speed for spin coating. However, if the depth of the groove formed by anisotropic etching reaches several 10 μm, the number of revolutions should be reduced to the order of 1000 rpm. If the number of revolutions is thus reduced, the discontinuity is not generated at the edge portion 6, whereas other problems such as the unsatisfactory spreading of the second photoresist 8, non-uniform thickness of the photoresist, and inability to perform fine photolithography may occur, so that was difficult to eliminate the discontinuity.

On the other hand, second-time anisotropic etching is performed according to the steps illustrated in FIGS. 6(a) to 6(f), which will be described below:

When the first-time anisotropic etching is completed, the $SiO_2$ film 2, which served as the first etching mask, is removed from the surface of the silicon substrate 1 (see FIG. 6(a)), followed by the thermal oxidation of the entire silicon substrate 1, so as to form a $SiO_2$ film 15, composed of a thermal oxidation film, which will serve as a second etching mask (see FIG. 6(b)). The second photoresist 8 is applied onto the surface of the $SiO_2$ film 15 and then formed into a pattern having a second opening B (see FIG. 6(c)). At this stage, however, the discontinuity mentioned above was already generated at the edge portion 6 of the first etched region 4.

If the second-time anisotropic etching is performed with the discontinuity remaining at the edge portion 6, after performing the etching process for patterning the $SiO_2$ film 15 (see FIG. 6(d)), the second photoresist 8 is removed (see FIG. 6(e)) and then the silicon substrate 1 underlying the opening B is grooved by anisotropic etching, thus forming a second etched region 10 (see FIG. 6(f)).

In this process, however, the silicon substrate 1 at the edge portion 6 of the first etched region 1 is also anisotropically etched, as shown in FIG. 6(f), so that the first etched region 4 is disadvantageously deformed.

Thus, if the $SiO_2$ film 15 is patterned by etching so as to form a second etching pattern with the discontinuity of the second photoresist 8 remaining at the edge portion 6 of the first etched region 4, the $SiO_2$ film at the edge portion 6, which should serve as the mask, is etched away, so that the edge portion 6 undergoes anisotropic etching in the subsequent anisotropic etching process, resulting in the deformation of the first etched region 4.

In the case where the second etched region is formed inside the first etched region 4 so as to obtain a silicon substrate of cross-sectional structure shown in FIG. 3, the first etched region 4 is also deformed through the same process as mentioned above, resulting in a second problem.

As shown in FIGS. 7(a) to 7(d), to realize the structure shown in FIG. 3, the silicon substrate 1 (see FIG. 7(a)) which has gone through the first-time etching (see FIGS. 4(a) to 4(g)) is thermally oxidized so as to form a $SiO_2$ film 20 (FIG. 7(b)). Then, the second photoresist (not shown) having the second opening B which extends from the left-hand edge 6a of the first etched region 4 is formed. The resulting second photoresist is used as a photomask in patterning the $SiO_2$ film 20 by etching, thereby forming the second etching mask (see FIG. 7(c)).

Even when the second photoresist is applied without generating a discontinuity at the edge portion 6, the edge portion 6a does not completely match the end portion of the mask, because, in most cases, there is the displacement of the mask Δd due to the imperfect precision with which the mask is aligned with respect to the edge portion 6a. If anisotropic etching is performed with such a mask displacement, the vicinity of the edge 6a, which corresponds to the edge portion 6 in above FIG. 4(f), is also etched, so that the first etched region is disadvantageously deformed (see FIG. 6(d)).

In this case, even if the width Δd of the mask displacement can be reduced to, e.g., 0.5 μm, the mask displacement can not be ignored because a flat plane is required on the level of the wavelength of light in the case of using the slant face of the etched region as, e.g., a reflecting mirror for a near infrared ray. Moreover, a real photoresist film has large waviness, so that it is difficult in practice to reduce the width Δd of the mask displacement to 0.5 μm or less.

SUMMARY OF THE INVENTION

An object of the present invention, which was achieved in view of the foregoing, is to effectively and eventually prevent the deformation of the semiconductor substrate at the edge of the concave portion, which was formed in the first anisotropic etching process, when the substrate is subjected to anisotropic etching at least twice.

To attain the above object, the method of etching a semiconductor substrate according to the present invention comprises the steps of: performing first-time anisotropic etching with respect to the semiconductor substrate by using a first etching mask having a specified opening so as to form first etched region hollowed in the semiconductor substrate which underlies the opening of said first etching mask; depositing a film for a second etching mask over said first etching mask and the first etched region; selectively etching said film for the second etching mask so as to form the second etching mask in a specified pattern; performing second-time anisotropic etching with respect to the semiconductor substrate by using said first and second etching masks; and previously forming said first etching mask from a material which is resistant to an etchant used in said second-time anisotropic etching and to an etchant used for patterning the second etching mask, before said first anisotropic etching is performed.

According to the etching method, before the second-time anisotropic etching is performed, the first etching mask is deposited on the edge of the first etched region which is hollow. Since the first etching mask is resistant to the etchant used in the second-time anisotropic etching and to the etchant used for patterning the second etching mask, the portion of the semiconductor substrate, which corresponds to the edge of the first etched region, is protected without being etched away. Consequently, the first etched region is not deformed by the second-time anisotropic etching and its configuration remains excellent.

The etching method according to the present invention can adopt the following preferred embodiment.

Preferably, either of the first and second etching masks is composed of a film consisting of one or more layers which is made of a dielectric material, while the other etching mask is composed of a film consisting of one or more layers which is made of a metallic material. According to the method, the chemical properties of the etching masks against the etchants, i.e., resistances, greatly differ from each other. Consequently, it becomes easy to select a solution which does not dissolve the first etching mask as the etchant for patterning the second etching mask.

The first etching mask is composed of an oxidation film of a semiconductor material which constitutes the substrate, while the second etching mask is composed of a film consisting of one or more layers which is made of a metallic material. The method facilitates the formation of the first etching mask.

To provide an excellent combination of the first and second etching masks, either of the two is composed of a silicon dioxide film, while the other is composed of a silicon nitride film. Alternatively, either of the first and second etching masks is composed of an aluminum oxide film, while the other etching mask is composed of a silicon dioxide film. The method facilitates the selection of an etchant which prevents the first etching mask from being etched in the second-time anisotropic etching.

By using a solution containing potassium hydroxide as its main component as the etchant used in the second-time anisotropic etching, the dissolving of the first etching mask can easily be avoided.

By composing at least one of the two anisotropic etching masks of Au, Pt, Ti, W, or a material containing one of these substances as its component, the etching mask can be formed simply by vacuum evaporation, so that the etching mask which is chemically stable can easily be obtained.

The etching mask can be composed of a metallic film consisting of two or more layers. Thus, the etching mask is provided with improved adhesion to the semiconductor substrate and improved resistance to an etchant used in anisotropic etching.

BRIEF DESCRIPTION OF THE DRAWINGS

FIGS. 1(a) to 1(n) are cross sections of a semiconductor substrate in individual steps of etching according to an embodiment of the present invention;

FIGS. 4(a) to 4(g) are cross sections of the semiconductor substrate in individual steps of the first-time anisotropic etching according to a conventional method of etching;

FIGS. 6(a) to (f) are cross sections of the semiconductor substrate in individual steps of the second-time anisotropic etching which is performed with respect to a portion other than the first etched region according to the conventional etching method.

DETAILED DESCRIPTION OF THE PREFERRED EMBODIMENT

Figure 2:
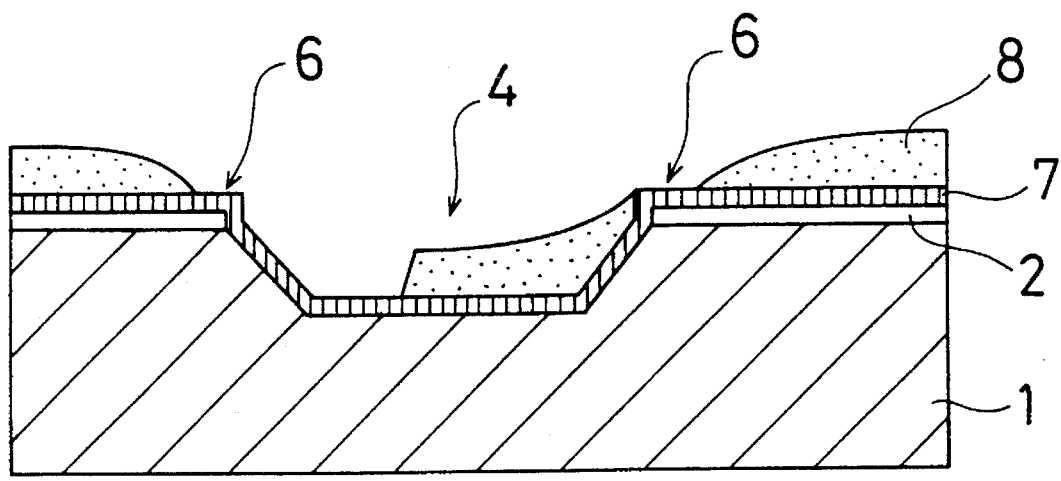
FIG. 2 is an enlarged view of a cross section of the substrate in the step of applying the photoresist for forming a second etching mask shown in FIG. 1(j)
Figure 3:
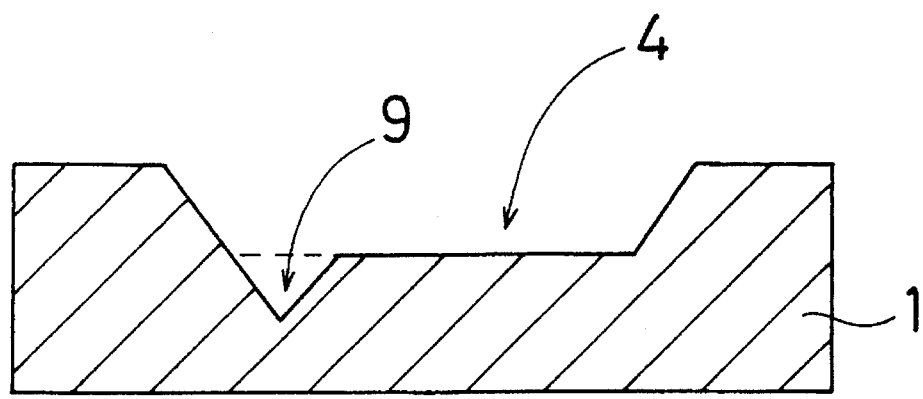
FIG. 3 is a cross section of the semiconductor substrate when two-stage anisotropic etching of the embodiment is completed.
Figure 5:
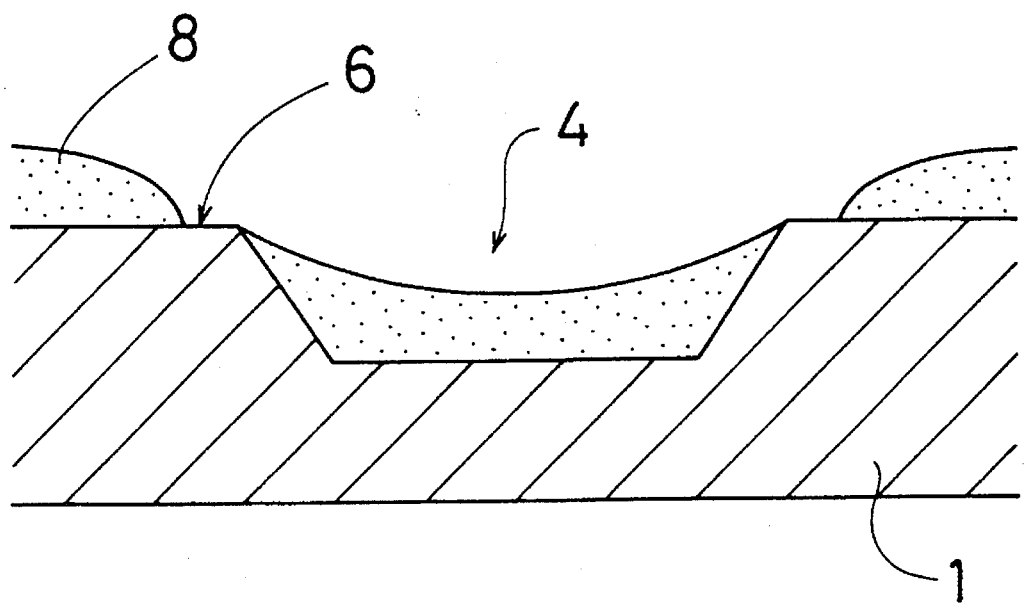
FIG. 5 is a cross section for illustrating a discontinuity of the photoresist which is generated in applying the photoresist to the semiconductor substrate with a concave portion.
Figure 7A:
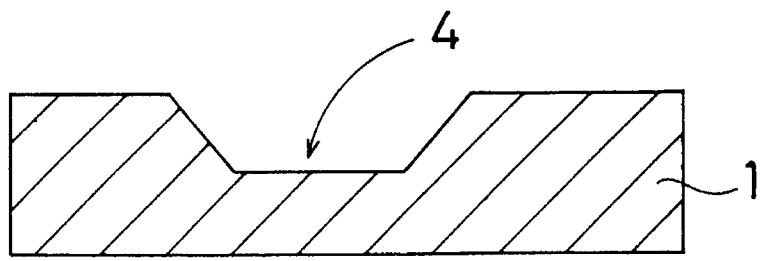
FIGS. 7(a)–(d) are a cross section of the semiconductor substrate in individual steps of the second-time anisotropic etching which is performed with respect to the inside of the first etched region according to the conventional etching method.
Figure 7B:
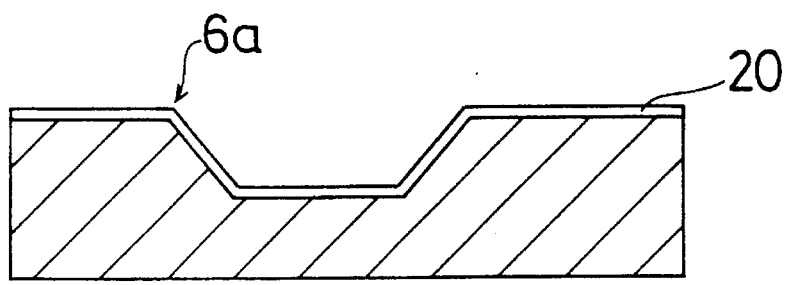
Figure 7C:
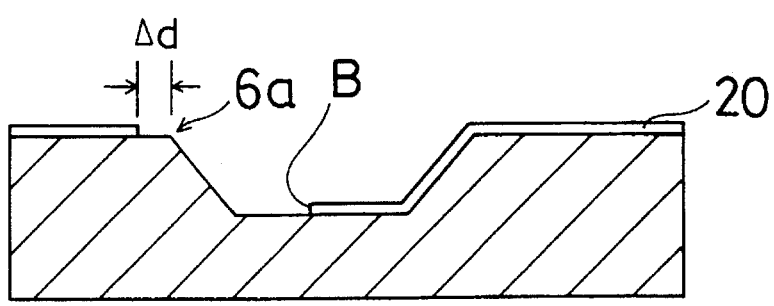
Figure 7D:
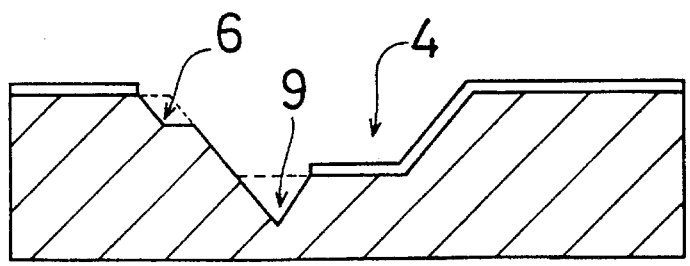

Below, an embodiment of the present invention will be described with reference to FIG. 1 to FIG. 3.

In the present embodiment which involves the first and second anisotropic etching processes performed with respect to the silicon substrate having the direction of surface plane (100), a process of forming the second etched region inside the first etched region will be described with reference to FIGS. 1(a) to 1(n).

First, a silicon substrate 1 composed of bare silicon (see FIG. 1(a)) is thermally oxidized so as to form a $SiO_2$ film 2 (see FIG. 1(b)). Next, a first photoresist 3 is applied (see FIG. 1(c)) so that the first photoresist 3 is formed into a pattern with an opening A (see FIG. 1(d)), followed by etching for forming a pattern out of the $SiO_2$ film 2 (see FIG.

1(e)). The etching can easily be performed by using an etchant containing HF as its main component. After removing the second photoresist 3 (see FIG. 1(f)), the entire silicon substrate 1 is subjected to first-time anisotropic etching so as to provide a first etched region 4 in the form of a truncated pyramid in the opening A (see FIG. 1(g)).

Subsequently, in performing the second-time anisotropic etching with the $SiO_2$ film 2 remaining, a Au film 7, which will serve as a second etching mask, is deposited by evaporation on the entire surface of the substrate (see FIG. 1(h)), followed by the application of a second photoresist 8 thereto (see FIG. 1(i)). After patterning the second photoresist 8 by photolithography (see FIG. 1(j)), the Au film 7 is patterned so as to form a second etching mask (see FIG. 1(k)). The etching can easily be performed in an iodine-potassium-iodide solution. Then, after removing the second photoresist 8 (see FIG. 1(l)), the second anisotropic etching is performed so as to form a second etched region 9 in the first etched region 4 (see FIG. 1(m)), followed by the removal of the Au film 7 and of the $SiO_2$ film 2, thus obtaining the silicon substrate 1 of structure shown in FIG. 3.

If a discontinuity of the second photoresist 8 is generated at the edge portion 6 after the first-time anisotropic etching of silicon or if a portion that should be covered by a resist pattern is not covered due to the displacement of the pattern, in the subsequent etching process for patterning the Au film 7 which will serve as the second etching mask, the Au film 7 at the edge portion 6 is partly dissolved in an iodine-potassium-iodide solution serving as the etchant for patterning. However, the underlying $SiO_2$ film 2 remains without being dissolved in the iodine-potassium-iodide solution. Consequently, the silicon substrate 1 at the edge portion 6 is protected in the second-time anisotropic etching, so that the deformation of the etched region 4 in the second anisotropic etching process is effectively prevented.

Thus, by composing the first and second anisotropic etching masks of a material that is not dissolved in an anisotropic etchant solution and by composing the first anisotropic etching mask of a material that is not dissolved in an etchant (the iodine-potassium-iodide solution in the present embodiment) used for patterning the second anisotropic etching mask 7, the edge portion 6 of the silicon substrate 1 is protected even in the case where a discontinuity of the second photoresist 8 is observed at the edge portion of the first etched region or the displacement of the resist pattern is observed after the first-time anisotropic etching of silicon, so that the second-time anisotropic etching can be performed without deforming the first etched region 4.

Although the present embodiment used the $SiO_2$ film as the first anisotropic etching mask and the Au film as the second anisotropic etching mask, they are not limited thereto provided that they are composed of a combination of dielectric or metallic materials having different chemical dissolving properties. For example, possible combinations of materials (along with their etchant solutions for patterning) in the case of using potassium hydroxide as the anisotropic etchant solution are shown in Table 1.

TABLE 1

| Material of 1st Etching Mask | Material of 2nd Etching Mask | Etchant for Patterning 2nd Etching Mask |
|---|---|---|
| $SiO_2$ | Au | Iodine-Potassium-Iodide Solution |
| SiN | Au | Iodine-Potassium-Iodide Solution |

TABLE 1-continued

| Material of 1st Etching Mask | Material of 2nd Etching Mask | Etchant for Patterning 2nd Etching Mask |
|---|---|---|
| Ti | Au | Iodine-Potassium-Iodide Solution |
| SiN | $SiO_2$ | Solution Containing Hydrofluoric Acid as Main Component |
| $SiO_2$ | SiN | Solution Containing Acetic Acid as Main Component |
| Au | Ti | Solution Containing Sulfuric Acid as Main Component |
| $Al_2O_3$ | $SiO_2$ | Solution Containing Hydrofluoric Acid as Main Component |
| $SiO_2$ | $Al_2O_3$ | Solution Containing Hydrochloric Acid As Main Component |

As shown above in Table 1, a combination of a silicon dioxide film and a silicon nitride film can exert the above effect of maintaining the configuration of the first etched region by using a solution, containing acetic acid as its main component, as the etchant for patterning the second etching mask if the first etching mask is composed of the silicon dioxide film and by using a solution, containing hydrofluoric acid as its main component, as the etchant for patterning the second etching mask if the first etching mask is composed of the silicon nitride film. A combination of a silicon dioxide film and an aluminum oxide film can exert a similar effect by using a solution, containing hydrochloric acid as its main component, as the etchant for patterning the second etching mask when the first etching mask is composed of the silicon dioxide and by using a solution, containing hydrofluoric acid as its main component, as the etchant for patterning the second etching mask if the first etching mask is composed of the aluminium oxide film.

Although the present embodiment used the Au film as a metallic material, it is possible to use Ti, Pt, W, or like material instead, provided that it is not dissolved in the anisotropic etchant solution.

It is also possible to obtain a particularly excellent etching mask by varying the combination of metallic materials. For example, the Au film exhibits poor adhesion to the silicon substrate and a Ti film exhibits less resistance to potassium hydroxide serving as the anisotropic etchant solution than the Au film does. However, if a two-layer metallic film consisting of Ti film/Au film is prepared, an etching mask which is excellent both in adhesion to silicon and in resistance to potassium hydroxide can be obtained.

In the case of using a metallic material for the etching mask, it can advantageously be formed by vacuum vapor deposition as shown in the present embodiment. When the metallic film is formed by vacuum vapor deposition, its resistance to a chemical agent seldom changes depending on the conditions of vapor deposition. Hence, the etching mask composed of a metallic film is extremely effective in that it can be formed more easily and stably than a dielectric mask.

Although the present invention presents the process in which anisotropic etching is performed twice, the number of times of anisotropic etching is not limited to twice. Even when anisotropic etching is performed a larger number of times, e.g., n times (n is an integer more than 2), a similar effect can be obtained by composing the n-th etching mask of a material different from that composing the previous etching masks.

Although the present embodiment used the silicon substrate, a similar effect can be obtained if a single-crystal substrate composed of another material is used instead.

Although the present embodiment used a wet-etching method in anisotropic etching or in etching for patterning an etching mask, a similar effect can be obtained by using a dry-etching method instead.

Although the foregoing embodiment used a method in which the second etching mask (a metallic film is used here) formed on the entire surface of the substrate by vapor deposition is etched away except for the region protected by the photoresist, the etching method according to the present invention is not limited to the embodiment. It is also possible, for example, to apply the present invention to a method in which, after a photoresist pattern corresponding to the reversed pattern of the mask is formed, a material for forming the second etching mask (a metallic film is used here) is deposited by evaporation and then a portion corresponding to an opening to the etching mask is removed together with the photoresist (generally termed a lift-off method).

We claim:

1. A method of etching a semiconductor substrate, comprising the steps of:

performing first-time anisotropic etching with respect to the semiconductor substrate by using a first etching mask comprised of an inorganic material, said first etching mask having a specified opening so as to form a first etched region hollowed in the semiconductor substrate which underlies the opening of said first etching mask;

depositing a film for a second etching mask over said first etching mask and said first etched region;

selectively etching said film for the second etching mask so as to form the second etching mask in a specified pattern, said second etching mask comprised of an inorganic material different from the inorganic material of said first etching mask;

performing second-time anisotropic etching with respect to the semiconductor substrate by using said first and second etching masks; and initially forming said first etching mask from a material which is resistant to an etchant used in said second-time anisotropic etching and to an etchant used for patterning the second etching mask, before said first-time anisotropic etching is performed.

2. A method of etching a semiconductor substrate according to claim 1, wherein either of said first and second etching masks is composed of a film consisting of one or more layers which is made of a dielectric material and the other etching mask is composed of a film consisting of one or more layers which is made of a metallic material.

3. A method of etching a semiconductor substrate according to claim 2, wherein said first etching mask is composed of an oxidation film of a semiconductor material constituting the semiconductor substrate and said second etching mask is composed of a film consisting of one or more layers which is made of a metallic material.

4. A method of etching a semiconductor substrate according to claim 1, 2 or 3, wherein at least one of said first and second etching masks is composed of a film consisting of two or more layers which is made of a metallic material.

5. A method of etching a semiconductor substrate according to claim 1, wherein either of said first and second etching masks is composed of a silicon dioxide film and the other etching mask is composed of a silicon nitride film.

6. A method of etching a semiconductor substrate according to claim 1, wherein either of said first and second etching masks is composed of an aluminium oxide film and the other etching mask is composed of a silicon dioxide film.

7. A method of etching a semiconductor substrate according to claim 2, 3, 5 or 6, wherein a solution containing potassium hydroxide as its main component is used as an etchant for performing the second-time anisotropic etching.

8. A method of etching a semiconductor substrate according to claim 1, wherein the second-time anisotropic etching is performed inside the first etched region.

9. A method of etching a semiconductor substrate according to claim 2, 3, or 8, wherein at least one of the first and second etching masks is made of Au, Pt, Ti, W, or a material containing one of these substances as its main component.

10. A method of etching a semiconductor substrate according to claim 1, 2, 3, 5, 6 or 8, wherein the semiconductor substrate is composed of single-crystal silicon.

11. A method of etching a semiconductor substrate according to claim 4, wherein the semiconductor substrate is composed of single-crystal silicon.

* * * * *